(12) United States Patent
Lee et al.

(10) Patent No.: US 11,856,741 B2
(45) Date of Patent: Dec. 26, 2023

(54) DISPLAY MODULE AND DISPLAY DEVICE

(71) Applicant: LG Display Co., Ltd., Seoul (KR)

(72) Inventors: Buhui Lee, Gumi-si (KR); Sangsoo Yoon, Gumi-si (KR); Dongwon Jang, Goyang-si (KR); Jongseok Cha, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 193 days.

(21) Appl. No.: 17/402,182

(22) Filed: Aug. 13, 2021

(65) Prior Publication Data

US 2022/0061195 A1 Feb. 24, 2022

(30) Foreign Application Priority Data

Aug. 24, 2020 (KR) .......................... 10-2020-0106279

(51) Int. Cl.
*H05K 7/20* (2006.01)
*H05K 1/18* (2006.01)
*H05K 1/02* (2006.01)

(52) U.S. Cl.
CPC ......... *H05K 7/20963* (2013.01); *H05K 1/028* (2013.01); *H05K 1/189* (2013.01); *H05K 2201/10128* (2013.01)

(58) Field of Classification Search
CPC .... H05K 7/20963; H05K 1/028; H05K 1/189; H05K 2201/10128
USPC ..................................................... 361/679.01
See application file for complete search history.

(56) References Cited

U.S. PATENT DOCUMENTS

| | | | |
|---|---|---|---|
| 2018/0157117 A1* | 6/2018 | Jeong ..................... | G02B 6/009 |
| 2020/0136066 A1* | 4/2020 | Jin .......................... | H10K 59/40 |

FOREIGN PATENT DOCUMENTS

KR 10-2020-0048205 A 5/2020

* cited by examiner

*Primary Examiner* — Binh B Tran
(74) *Attorney, Agent, or Firm* — Seed IP Law Group LLP

(57) ABSTRACT

A display apparatus capable of improving heat-dissipation performance while not increasing a total thickness thereof include a heat-dissipation member accommodated in a cushion plate. Thus, the heat-dissipation performance may be improved without increasing a thickness of the display apparatus. Thus, a mounting space for components may be secured without increasing a bezel area. Further, the heat-dissipation member having a predetermined thickness and an air gap are disposed in the heat-dissipation member accommodating space of the cushion plate, thereby maximizing the heat-dissipation from a driving integrated circuit disposed under the cushion plate so as to overlap the heat-dissipation member accommodating space.

20 Claims, 6 Drawing Sheets

DISPLAY MODULE AND DISPLAY DEVICE

CROSS-REFERENCE TO RELATED APPLICATION

This application claims priority to Korean Patent Application No. 10-2020-0106279 filed on Aug. 24, 2020, in the Korean Intellectual Property Office, the entire disclosure of which is incorporated herein by reference.

BACKGROUND

Technical Field

The present disclosure relates to a display apparatus, and more specifically, a display apparatus capable of improving heat-dissipation performance while not increasing a total thickness thereof.

Description of the Related Art

A display apparatus is implemented in a wide variety of forms such as televisions, monitors, smart phones, tablet PCs, notebook computers, and wearable apparatuses.

In general, the display apparatus includes a display area displaying a screen and a non-display area along an outer periphery of the display area.

The display apparatus may include various additional components such as a driving integrated circuit or a circuit board in addition to a display panel to display the screen. In the non-display area, the additional components may be disposed, or various connection components such as a flexible circuit board for connecting the additional components to each other may be disposed.

In the display apparatus, the non-display area is also referred to a bezel area. When the bezel area is wide, a user's gaze is wide. However, when the bezel area is thinner, the user's gaze is fixed on the screen of the display area such that user immersion increases.

In other words, when the bezel area becomes narrower, a total size of the display apparatus may be reduced while increasing the user immersion. Accordingly, demand from the user for the display apparatus that may reduce the bezel area as much as possible is increasing.

BRIEF SUMMARY

In the display apparatus, in order to secure the display area as large as possible and to minimize the bezel area, the various additional components such as the driving integrated circuit or the circuit board may be mounted on or connected to the connecting component such as the flexible circuit board and thus be disposed on a lower surface of the display panel.

For example, the flexible circuit board connected to one distal end of the display panel may be bent in a direction toward the lower surface of the display panel in the bezel area. Alternatively, as one distal end of the display panel is bent toward the lower surface of the display panel, the various additional components may be disposed on the lower surface of the display panel.

When the display apparatus operates, considerable high heat is generated in the driving integrated circuit. Accordingly, a heat dissipation layer may be provided on a rear face of the display panel in order to dissipate heat from the driving integrated circuit.

However, in order to effectively dissipate the high temperature heat from the driving integrated circuit, the heat-dissipation layer may be thickened. In this case, a total thickness of the display apparatus increases by the added thickness of the heat-dissipation layer. This may lead to an increase in the bezel area.

Further, after a process of bending the display panel proceeds, it is difficult to additionally attach the heat-dissipation layer in terms of a process. Thus, effective heat-dissipation of the driving integrated circuit may be not achieved.

Accordingly, the inventors of the present disclosure have invented a display apparatus capable of improving heat-dissipation performance without increasing the total thickness thereof.

A purpose to be achieved according to an embodiment of the present disclosure is to provide a display apparatus capable of improving heat-dissipation performance without increasing the total thickness of the display apparatus.

A purpose to be achieved according to an embodiment of the present disclosure is to provide a display apparatus capable of improving heat-dissipation performance while not being affected by a bending process of the display panel.

A purpose to be achieved according to an embodiment of the present disclosure is to provide a display apparatus capable of improving heat-dissipation performance while maintaining rigidity.

A purpose to be achieved according to an embodiment of the present disclosure is to provide a display apparatus capable of minimizing dust generation from or damage to a heat-dissipation member even when pressure is applied to the heat-dissipation member.

A purpose to be achieved according to an embodiment of the present disclosure is to provide a display apparatus that may minimize deformation of a display panel due to a pressure against an upper surface that may occur on the display panel when the display panel is bent.

A purpose to be achieved according to an embodiment of the present disclosure is to provide a display apparatus capable of maximizing a heat-dissipation effect for dissipating the heat from the driving integrated circuit that generates high heat.

Purposes to be achieved according to an embodiment of the present disclosure are not limited to the purpose as mentioned above. Other purposes that are not mentioned may be clearly understood by those skilled in the art based on following descriptions.

A display apparatus according to an embodiment of the present disclosure a display panel including a front part, a bent part, and a rear part; a first plate disposed at a lower portion of the front part; a second plate disposed at a lower portion of the display panel, the rear part of the display panel being disposed at a lower portion of the second plate; a heat-dissipation member accommodating space disposed in the second plate; and a heat-dissipation member in the heat-dissipation member accommodating space.

In this case, a heat-dissipation member accommodating space is disposed inside the cushion plate, and a heat-dissipation member is inserted in the heat-dissipation member accommodating space, thereby improving heat-dissipation performance while maintaining rigidity without increasing a total thickness of the display apparatus.

A driving integrated circuit is disposed under the rear part, and the driving integrated circuit is disposed so as to overlap with the heat-dissipation member accommodating space, such that the heat-dissipation member inserted in the accommodating space may effectively dissipate the heat from the driving integrated circuit.

The heat-dissipation member may be in contact with a upper inner surface and a lower inner surface of the cushion plate defining the heat-dissipation member accommodating space and may be spaced by a predetermined distance from an inner side surface of the cushion plate defining the heat-dissipation member accommodating space. Thus, interference that may occur between the heat-dissipation member and the cushion plate may be minimized, and the pressure against the upper surface of the panel that may occur when the display panel is bent may be minimized.

An air gap may be defined between the heat-dissipation member and the inner side surface of the cushion plate defining the heat-dissipation member accommodating space, thereby further improving the heat-dissipation effect.

The cushion plate may include a heat-dissipation layer, an anti-lift layer, a cushion layer and an embossed layer. The heat-dissipation member accommodating space may be free of the anti-lift layer and the cushion layer. A upper surface of the heat-dissipation member may contact the embossed layer, and a lower surface of the heat-dissipation member may contact the heat-dissipation layer.

A display apparatus according to an embodiment of the present disclosure includes a cover member, a display device according to an embodiment of the present disclosure coupled to a lower surface of the cover member, and a frame disposed on a lower surface of the display device to support the cover member.

According to an embodiment of the present disclosure, the heat-dissipation member may be received inside the cushion plate. Thus, the heat-dissipation performance may be improved without increasing the total thickness of the display apparatus. Thus, a mounting space for the components may be secured without increasing the bezel area.

Further, since the display panel is fixed to the cushion plate when the display panel is bent, it is difficult to attach an additional heat-dissipation layer thereto. However, according to the present disclosure, the heat-dissipation member is inserted inside the cushion plate, thereby improving the heat-dissipation performance while not being affected by the bending process of the display panel.

Further, according to an embodiment of the present disclosure, because the heat-dissipation member is inserted in an inner partial area of the cushion plate, a basic shape of the cushion plate may be maintained, thereby improving the heat-dissipation performance while maintaining the rigidity of the display apparatus.

Further, according to an embodiment of the present disclosure, the heat-dissipation member is spaced by a predetermined distance, from the inner side surface of the cushion plate defining the heat-dissipation member accommodating space. Thus, when the cushion plate is pressurized such that the pressure is applied to the heat-dissipation member, the interference that may occur between the heat-dissipation member and the cushion plate may be minimized, thereby minimizing dust generation from and damage to the heat-dissipation member.

Further, according to an embodiment of the present disclosure, the airgap may be provided between the heat-dissipation member and the inner side surface of the cushion plate defining the heat-dissipation member accommodating space, and may act as impact absorbing means. Thus, even when the display panel is bent and the bent panel fixing member is attached thereto, the deformation of the panel due to the pressure against the upper surface of the display panel may be minimized.

Further, according to an embodiment of the present disclosure, the heat-dissipation member having a predetermined thickness and the air gap may be disposed in the heat-dissipation member accommodating space of the cushion plate, thereby maximizing the heat-dissipation from the driving integrated circuit disposed under the cushion plate so as to overlap the heat-dissipation member accommodating space.

Effects of the present disclosure are not limited to the above-mentioned effects, and other effects as not mentioned will be clearly understood by those skilled in the art from following descriptions.

DETAILED DESCRIPTION

Figure 1A:
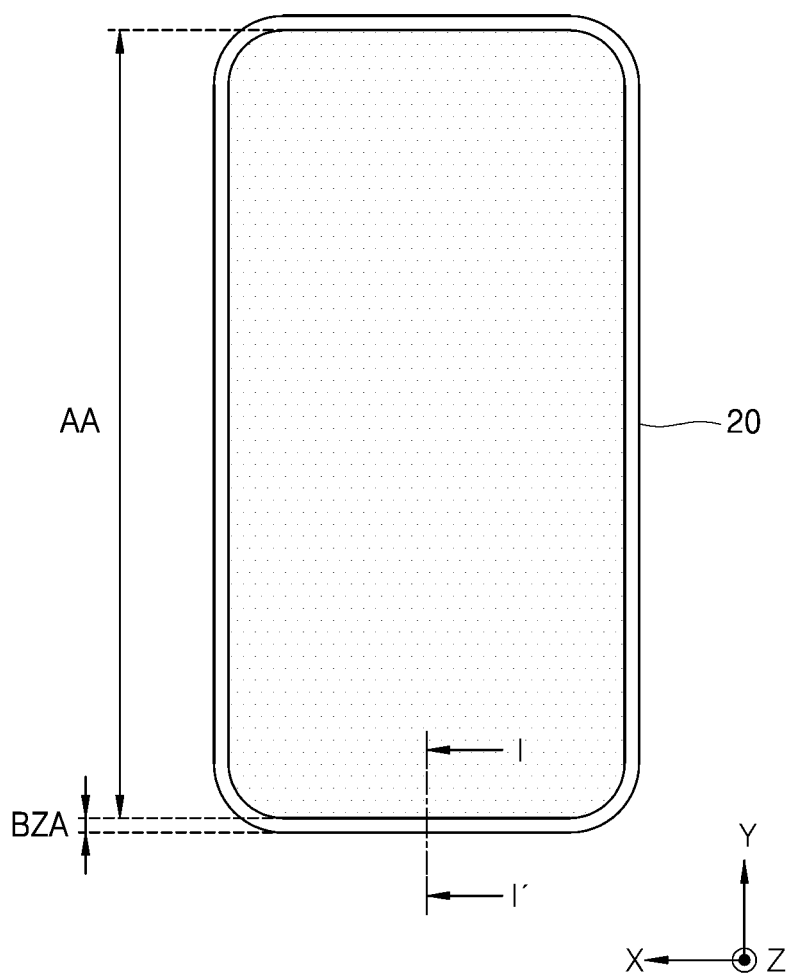
FIGS. 1A and 1B respectively show a front surface and a rear surface of a display apparatus according to an embodiment of the present disclosure.

Advantages and features of the present disclosure, and a method of achieving the Advantages and features will become apparent with reference to embodiments described later in detail together with the accompanying drawings. However, the present disclosure is not limited to the embodiments as disclosed below, but may be implemented in various different forms. Thus, these embodiments are set forth only to make the present disclosure complete, and to completely inform the scope of the disclosure to those of ordinary skill in the technical field to which the present disclosure belongs, and the present disclosure is only defined by the scope of the claims.

A shape, a size, a ratio, an angle, a number, etc., disclosed in the drawings for describing the embodiments of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to," or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

In descriptions of temporal relationships, for example, temporal precedent relationships between two events such as "after," "subsequent to," "before," etc., another event may occur therebetween unless "directly after," "directly subsequent" or "directly before" is not indicated.

It will be understood that, although the terms "first," "second," "third," and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various embodiments of the present disclosure may be partially or entirely combined with each other, and may be technically associated with each other or operate with each other. The embodiments may be implemented independently of each other and may be implemented together in an association relationship.

Hereinafter, various configurations of a display apparatus that may improve a heat-dissipation performance while not increasing a total thickness thereof will be described in detail.

Figure 1B:
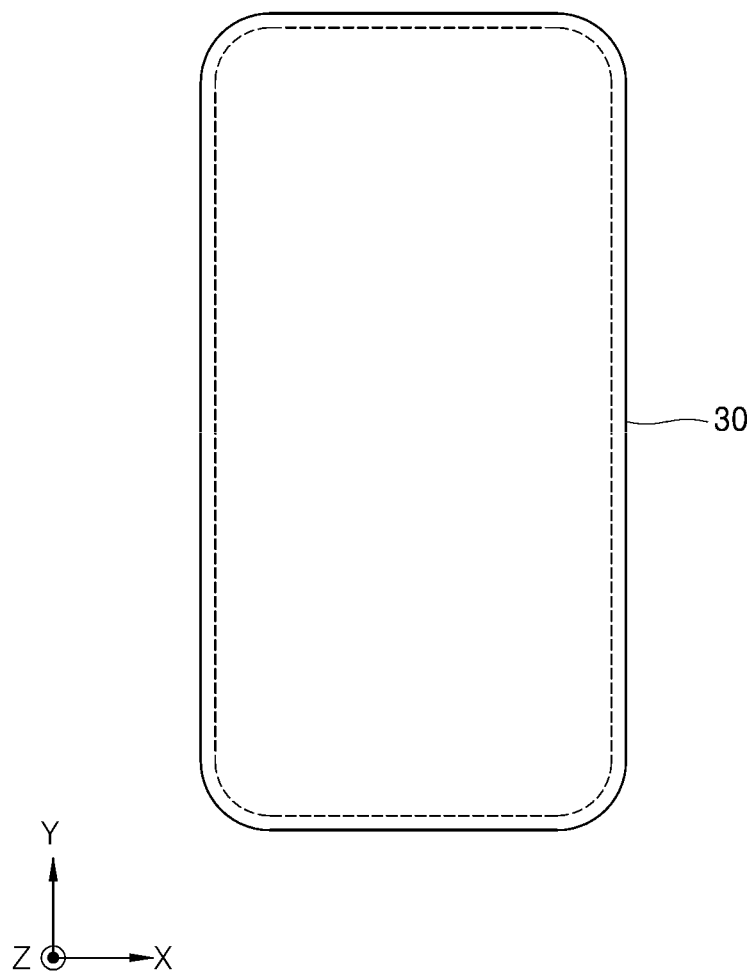

FIG. 1A illustrates a front surface of a display apparatus 1 on which a display area AA is disposed, and FIG. 1B illustrates a rear surface of display apparatus 1.

The display apparatus 1 includes a cover member 20, a display device 10 coupled to a lower surface of cover member 20, and a frame 30 disposed at a rear surface of display device 10 to support the cover member 20.

The cover member 20 may be disposed to cover a front surface of the display device 10, and thus may protect the display device 10 from external shocks.

An edge or periphery of the cover member 20 may have a round shape in which the edge thereof is curved toward a rear surface thereof on which the display device 10 is disposed.

In this case, the cover member 20 may cover at least a partial area of a side surface of display device 10 disposed at the rear surface thereof, thus protecting not only a front surface of the display device 10, but also the side surface thereof from an external shock.

The cover member 20 includes the display area AA that displays an image, and thus may be formed of a transparent material such as a cover glass to display the image. For example, the cover member 20 may be formed of a transparent plastic material, a glass material, or a reinforced glass material.

The frame 30 may be disposed at the rear surface of the display device 10 and therein accommodate the display device 10 and contact the cover member 20 to support the cover member 20.

The frame 30 serves as a housing that defines a rear surface of an outermost portion of the display apparatus 1, and may be formed of various materials such as plastic, metal, or glass.

Further, the front surface of the cover member 20 may include the display area AA and the non-display area as an area other than the display area AA. The non-display area may be formed along an edge or periphery of the display area AA, and the non-display area may be defined as a bezel area BZA.

The display device 10 coupled or connected to the rear surface of the cover member 20 may have a bent part BNP. The bent part BNP may be disposed in the bezel area BZA and blow the cover member 20 in a Y-axis direction.

To reduce the bezel area BZA under the cover member 20, it is preferred to reduce a radius of curvature of the bent part BNP.

The radius of curvature of the bent part BNP is proportional to a total thickness of the display device 10 and the display apparatus 1. Thus, as the total thickness increases, the radius of curvature of the bent part BNP increases. When the total thickness decreases, the radius of curvature of the bent part BNP decreases.

Therefore, in order not to increase the size of the bezel area BZA, it is preferred to prevent the total thickness of display device 10 and the display apparatus 1 from increasing.

Figure 2:
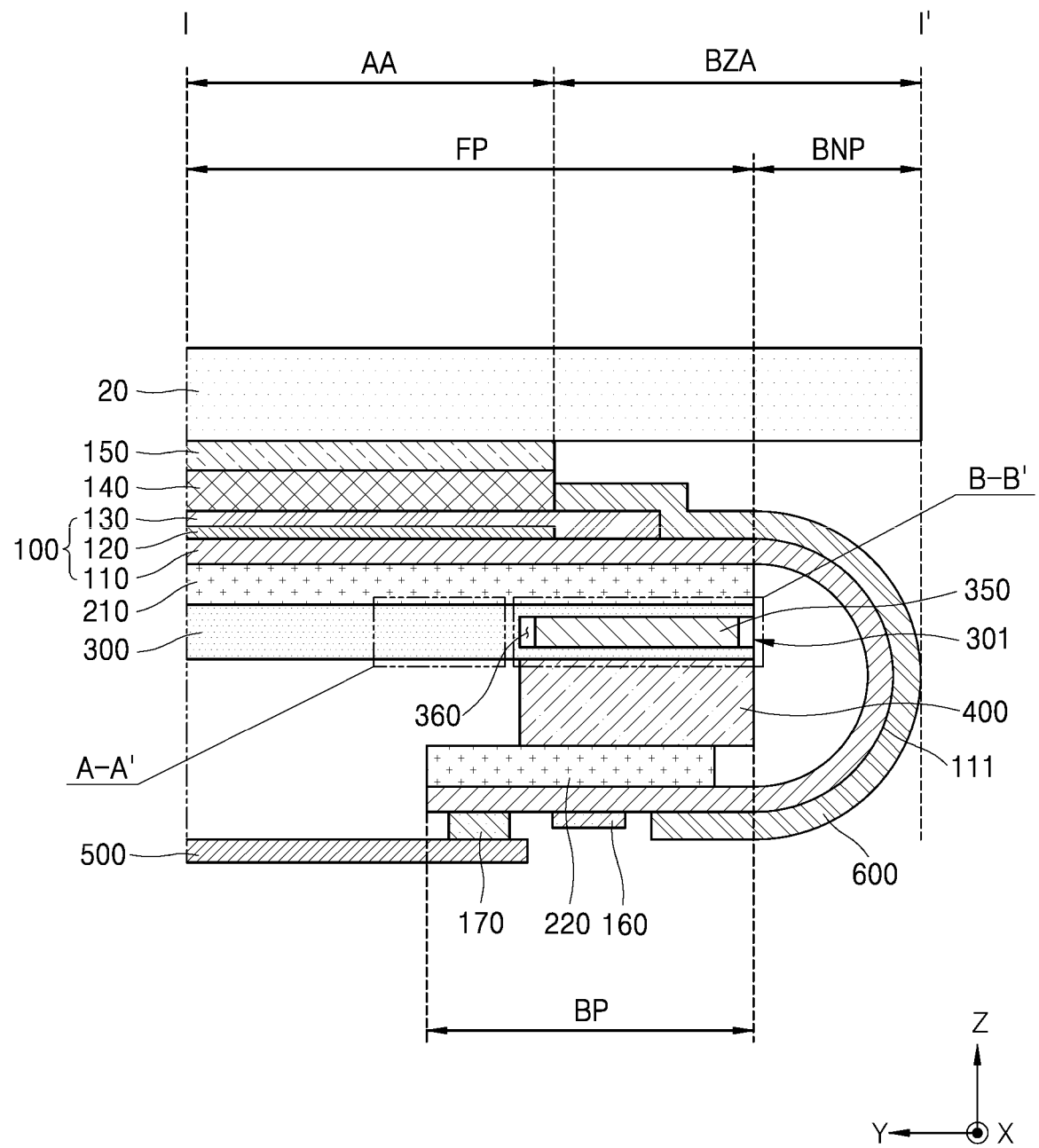
FIG. 2 is a cross-sectional view of a display apparatus according to an embodiment of the present disclosure.

Hereinafter, the display device 10 according to an embodiment of the present disclosure will be described in detail with reference to FIG. 2.

The display device 10 is coupled or connected to the rear surface of the cover member 20.

The display device 10 includes a display panel 100 including a front part FP, a bent part BNP and a rear part BP, a first plate 210 disposed under the front part FP, a cushion plate 300 disposed under the first plate 210, a connection member 400 disposed under the cushion plate 300, and a second plate 220 disposed under the connection member 400, wherein the rear part BP is disposed under the second plate 220. For example, the cushion plate 300 may be a second plate, and the second plate 220 may be a third plate, and embodiments of the present disclosure are not limited thereto.

In this case, a heat-dissipation member accommodating space 301 is disposed inside the cushion plate 300, and the heat-dissipation member 350 is inserted or accommodated in the heat-dissipation member accommodating space 301.

Since the module connection member 150 may be disposed to overlap the display area AA, the module connection member 150 may be formed of a transparent adhesive member. For example, the module connection member 150 may include a material such as OCA (Optical Clear Adhesive), OCR (Optical Clear Resin), or PSA (Pressure Sensitive Adhesive).

A functional film 140 may be additionally disposed between the module connection member 150 and the display panel 100. The functional film 140 may have a structure in which one or more functional layers are stacked, but embodiments of the present disclosure are not limited thereto.

In an embodiment of the present disclosure, the functional film 140 may include an antireflection layer such as a polarizing film that prevents reflection of external light to improve an outdoor visibility and a contrast ratio for an image displayed on the display panel 100.

In addition, in an embodiment of the present disclosure, the functional film 140 may further include a barrier layer configured to prevent moisture or oxygen invasion. The barrier layer may be made of a material having low moisture permeability, such as a polymer material.

Further, the functional film 140 may further include an optical path control layer that controls a path of light emitted from the pixel array part 120 toward the cover member 20. The optical path control layer may have a structure in which high and low refractive layers are alternately stacked and may change the path of light incident from the pixel array part 120 such that a color shift according to the viewing angle may be minimized.

The display panel 100 may include a display substrate 110, a pixel array part 120 disposed on the display substrate 110, and an encapsulation portion 130 disposed to cover the pixel array part 120.

The display substrate 110 may serve as a base substrate of the display panel 100. The display substrate 110 may be made of a flexible plastic material and thus may act as a flexible display substrate.

In an embodiment of the present disclosure, the display substrate may be made of polyimide as a plastic material having flexibility, or may be made of a thin-type glass material having flexibility.

The pixel array part 120 may correspond to an area configured to display the image toward the upper surface of the cover member 20, and thus may correspond to the display area AA.

Therefore, the area corresponding to the pixel array part 120 in the cover member 20 may be the display area AA, and the area other than the display area AA may be the bezel area BZA.

The pixel array part 120 may be implemented using various elements that display an image, and may not be particularly limited.

The pixel array part 120 may include a plurality of pixels that are arranged at a pixel area defined by signal lines on the display substrate 110, and display an image according to signals supplied to the signal lines. The signal lines may include a gate line, a data line, and a pixel driving power line.

Each of the plurality of pixels may include a driving thin film transistor at the pixel area, an anode electrically connected to the driving thin film transistor, a light-emissive element layer formed on the anode, and a cathode electrically connected to the light-emissive element layer.

The driving thin film transistor may include a gate electrode, a semiconductor layer, a source electrode, a drain electrode, and the like. The semiconductor layer of the thin film transistor may include silicon such as a-Si, poly-Si, or low-temperature poly-Si, or an oxide such as IGZO (Indium-Gallium-Zinc-Oxide).

The anode may be disposed at each pixel in a corresponding manner to an opening area provided according to a pattern shape of a pixel, and may be electrically connected to the driving thin film transistor.

In an embodiment of the present disclosure, the light-emissive element layer may include an organic light-emissive element formed on the anode. The organic light-emissive element at each pixel area may be implemented to emit light of the same color such as white light or may be implemented to emit light beams of different colors such as red, green, and blue light beams.

In another embodiment of the present disclosure, the light-emissive element layer may include a micro light-emissive diode element electrically connected to each of the anode and the cathode. The micro light-emissive diode element refers to a light-emissive diode implemented in a form of an integrated circuit (IC) or a chip, and may include a first terminal electrically connected to the anode and a second terminal electrically connected to the cathode.

The cathode may be commonly connected to a light-emissive element of a light-emissive element layer provided at each pixel area.

The encapsulation portion 130 is formed on the display substrate 110 to cover the pixel array part 120, such that oxygen, moisture, or foreign substances may be prevented from penetrating into the light-emissive element layer of the pixel array part 120. In one example, the encapsulation portion 130 may be formed in a multilayer structure in which organic material layers and inorganic material layers are alternately stacked.

The display panel 100 may be divided into a front part FP, a bent part BNP, and a rear part BP.

The front part FP of the display panel 100 constitutes a part on which the image is displayed. The rear part BP bent from the bent part BNP toward a rear surface of the front part FP, and the rear part BP is disposed at a rear portion of the front part EP, for example, a rear surface of the front part FP.

In detail, when the display panel 100 is bent, the pixel array part 120 and the encapsulation portion 130 constitute the front part FP and thus are not bent, and a partial area of the display substrate 110 corresponding to the rear part BP is bent from the bent part BNP and disposed at the rear surface of the front part FP.

The first backplate 210 may be disposed at lower portion of the front part FP of the display panel 100. The first backplate 210 may be a first plate, but embodiments of the present disclosure are not limited thereto.

The first backplate 210 is disposed at a lower portion of the display substrate 110 to supplement rigidity of the display substrate 110, while maintaining a portion of the display substrate 110 constituting the front part FP in a flat state.

Since the first backplate 210 is formed to have a certain strength and a certain thickness to compensate for the rigidity of the display substrate 110, the first backplate 210 may not be formed at a portion of the display panel 100 constituting the bent part BNP.

In an embodiment of the present disclosure, the second backplate 220 is disposed at the rear part BP of the display panel 100 which bent from the bent part BNP of the display panel 100 and is disposed at the rear surface of the front part FP. The second backplate 220 may be a second plate or a third plate, but embodiments of the present disclosure are not limited thereto.

Before the display panel 100 is bent, with respect to the non-bending shape of the display panel, the second backplate 220 is disposed under the display substrate 110 and is spaced apart from the first backplate 210.

In detail, the second backplate 220 is disposed at a lower portion of the rear part BP of the display panel 100.

The second backplate 220 is disposed under the display substrate 110 to supplement or compensate the rigidity of the display substrate 110, while maintaining a portion of the display substrate 110 constituting the rear part BP in a flat state.

Since the second backplate 220 is formed to have a certain strength and a certain thickness to supplement the rigidity of the display substrate 110, the second backplate 220 may not be formed in a portion of the display panel 100 corresponding to the bent part BNP.

After the display panel 100 is bent, the second backplate 220 is placed at the rear part BP of the display panel 100, and is disposed between the front part FP and the rear part BP. In other words, while the display panel 100 is bent, the second backplate 220 is disposed under the front part FP of the display panel 100, and is disposed at an upper portion of the rear part BP of the display panel 100.

The cushion plate 300 may be disposed under the first backplate 210.

Figure 3:
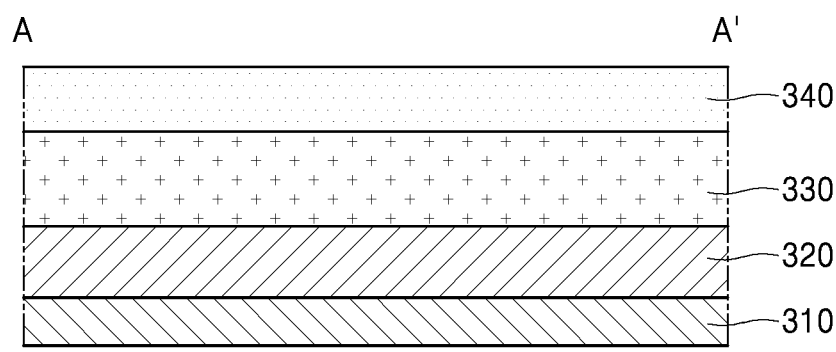
FIG. 3 is a cross-sectional view of a plate according to an embodiment of the present disclosure.

The cushion plate 300 may include a heat-dissipation layer 310, an anti-lift layer 320, a cushion layer 330, and an embossed layer 340, as shown in FIG. 3. The heat-dissipation layer 310, the anti-lift layer 320, the cushion layer 330, and the embossed layer 340 may be stacked in sequence with respect to a Z-axis direction.

The heat-dissipation layer 310 may be configured to have a heat-dissipation characteristic to a component generating a high temperature, and may include a material having a high thermal conductivity.

In an embodiment of the present disclosure, the heat-dissipation layer 310 may include a metal layer having high thermal conductivity such as copper (Cu), or may include a graphite layer. The heat-dissipation layer 310 may have a heat-dissipation function, a grounding function, and a function to protect the rear surface of the display substrate 110.

In order to have an effective heat-dissipation characteristic, the heat-dissipation layer 310 preferably has a thickness of at least 30 μm.

The anti-lift layer 320 may be disposed on the heat-dissipation layer 310. The anti-lift layer 320 may be formed of a flexible material such as polyimide film.

When an edge or periphery portion of the cover member 20 has a rounding shape that is formed to be curved toward a lower surface thereof on which the display device 10 is disposed, and thus has a curved portion, the cushion plate 300 attached to a lower surface of the cover member occur a lift defect.

Accordingly, the cushion plate 300 includes the flexible anti-lift layer 320, thereby minimizing or reducing the lift defect that may occur when forming the curved portion of the cover member 20.

In order to have an effective anti-lift effect, the anti-lift layer 320 preferably has a thickness of at least 40 μm.

The cushion layer 330 is disposed on the anti-lift layer 320, and may include a foam tape or a foam pad. The cushion layer 330 may function to alleviate or release the impact to various components that may contact the cushion plate 300.

The cushion layer 330 having an impact relaxation function may increase the rigidity of the cushion plate 300.

In order for the cushion layer 330 to have an effective impact mitigating function and the rigidity enhancing effect, the layer 330 may have a thickness of at least 80 μm.

The embossed layer 340 is disposed on the cushion layer 330, and may include an uneven structure formed at a surface thereof. The uneven structure of the embossed layer 340 prevents bubbles from being generated between the first backplate 210 and the cushion plate 300 when the cushion plate 300 is attached to the first backplate 210, thereby omitting a defoaming process for removing the bubbles.

The embossed layer 340 may be a layer that directly contacts the first backplate 210 to fix the cushion plate 300 to the first backplate 210, and may function as an adhesive layer including an adhesive component.

In order for the embossed layer 340 to have an effective anti-bubble effect, it is desirable that the layer 340 has a thickness of at least 40 μm.

The bent panel fixing member 400 is placed under the cushion plate 300. The bent panel fixing member 400 may be a connection member or a coupling member, but embodiments of the present disclosure are not limited thereto.

When bending the bent part BNP of the display panel 100 so that the rear part BP of the display panel 100 is placed under the front part FP of the display panel 100, a restoring force to restore the display panel 100 to a state before the display panel 100 is bent may be applied to the display panel 100.

When the restoring force acts strongly, the rear part BP of the bent display panel 100 may not be fixedly maintained but may be lifted.

The bent panel fixing member 400 is disposed between the front part FP of the display panel 100 and the rear part BP thereof to fix the bent display panel 100 such that the panel is maintained at the bent state.

The bent panel fixing member 400 is formed to have a certain thickness in a thickness direction of the bent part. The bent panel fixing member 400 may be embodied as a double-sided tape with strong adhesive strength that may secure bonding between the front part FP of the display panel 100 and the rear part BP thereof.

Further, the bent panel fixing member 400 may be embodied as a foam tape, or a foam pad, and may function as a shock absorber.

Further, the bent panel fixing member 400 may be embodied as a double-sided conductive tape having conductivity. For example, the double-sided conductive tape may include a conductive layer between an upper adhesive layer and a lower adhesive layer, and the adhesive layer may include a conductive material.

In one example, a driving integrated circuit 160 may be disposed on an opposite surface of the rear part BP of the display panel 100 to one surface thereof on which the second backplate 220 is disposed.

In an embodiment of the present disclosure, it is assumed that the driving integrated circuit 160 is embodied as COP (Chip On Plastic) mounted on the display substrate 110. However, embodiments of the present disclosure are not limited thereto.

The driving integrated circuit 160 may be mounted on the display substrate 110 using a chip bonding process or a surface mounting process. With respect to the bent state, the driving integrated circuit 160 may be disposed at a lower surface of the display substrate 110.

The driving integrated circuit 160 generates a data signal and a gate control signal based on image data and a timing synchronization signal supplied from an external host driving system. In addition, the driving integrated circuit 160 may supply the data signal to a data line of each pixel through the display pad part, and may supply the gate control signal to a gate driving circuitry through the display pad part.

That is, the driving integrated circuit 160 may be mounted on a chip mounting area defined on the display substrate 110 and may be electrically connected to the display pad parts, and the display pads may be respectively connected to signal lines of each of the gate driving circuitry and the pixel array part 120 disposed on the display substrate 110.

Since the driving integrated circuit 160 generates a considerable amount of heat, it is necessary to effectively dissipate heat from the driving integrated circuit 160.

Accordingly, the heat-dissipation member accommodating space 301 is disposed in the cushion plate 300 according to an embodiment of the present disclosure. A heat-dissipation member 350 having a predetermined thickness is inserted or accommodated in the heat-dissipation member accommodating space 301.

Because the heat-dissipation member 350 acts as a separate layer from the cushion plate 300 and is not stacked vertically thereon, but is inserted or accommodated inside the cushion plate 300 according to an embodiment of the present disclosure, the heat-dissipation performance may be improved without increasing the thickness of each of the display device 10 and the display apparatus 1.

When a thickness of the bent part BNP as a distance between the front part FP and the rear part BP in the display device 10 increases, the bezel area may increase due to an increase in the radius of curvature of the bent part BNP.

However, according to an embodiment of the present disclosure, the heat-dissipation member 350 is inserted or accommodated inside the cushion plate 300, thereby securing a space for mounting the components without increasing the bezel area.

Further, when bending the bent part BNP of the display panel 100, the rear part BP is fixed to or connected to the cushion plate 300. Thus, it is difficult to attach an additional heat-dissipation layer after bending in a manufacturing process.

However, according to an embodiment of the present disclosure, since the heat-dissipation member 350 is inserted or accommodated inside the cushion plate 300, the heat-dissipation member 350 may be formed together during a forming process of the cushion plate 300.

In other words, the display panel 100 is bent so that the heat-dissipation member 350 having a predetermined thickness is formed at the rear part BP in advance, regardless of the bending process of the display panel 100, thereby improving the heat-dissipation performance while not being affected by the bending process of the display panel 100.

The bent panel fixing member 400 is placed under the cushion plate 300, and the second backplate 220 is placed under the bent panel fixing member 400. The rear part BP of the display panel 100 is disposed under the second backplate 220, and the driving integrated circuit 160 is disposed under the rear part BP of the display panel 100.

In this case, the driving integrated circuit 160 generates considerable high heat. Thus, arranging the driving integrated circuit 160 so as to overlap the heat-dissipation member accommodating space 301 in the Z-axis direction may allow the heat-dissipation effect to be maximized.

The cushion plate 300 includes the heat-dissipation layer 310. However, in order to perform the heat-dissipation form the high-temperature driving integrated circuit 160 more effectively, only the heat-dissipation layer 310 of the cushion plate 300 may be insufficient.

Therefore, according to an embodiment of the present disclosure, arranging the driving integrated circuit 160 so as to overlap the heat-dissipation member accommodating space 301 of the cushion plate 300 in which the additional heat-dissipation member 350 is inserted or accommodated in the vertical direction that is, in the Z-axis direction may allow the distance between the heat-dissipation member 350 and the driving integrated circuit 160 to be minimized or reduced. Thus, the heat-dissipation effect may be further maximized.

In one example, the heat-dissipation member accommodating space 301 and the heat-dissipation member 350 of the cushion plate 300 should be described in more detail with reference to FIG. 4 and FIG. 5.

The cushion plate 300 includes the heat-dissipation layer 310, the anti-lift layer 320, the cushion layer 330 and the embossed layer 340. The heat-dissipation member accommodating space 301 is free of the anti-lift layer 320 and the cushion layer 330. That is, the heat-dissipation member accommodating space 301 may be formed by partially removing the anti-lift layer 320 and the cushion layer 330.

Therefore, the heat-dissipation member 350 may contact the upper surface and the lower surface of the heat-dissipation member accommodating space 301. Accordingly, the upper surface of the heat-dissipation member 350 may directly contact the embossed layer 340 of the cushion plate 300, and the lower surface of the heat-dissipation member 350 may directly contact the heat-dissipation layer 310 of the cushion plate 300.

While the heat-dissipation member 350 is inserted or accommodated into the cushion plate 300, the heat-dissipation member 350 supports the cushion plate 300 while directly contacting the outermost layers of the cushion plate 300 so that the basic shape of the cushion plate 300 is maintained.

In other words, because the heat-dissipation member 350 is inserted or accommodated into the cushion plate 300 to support the cushion plate 300 so that the basic shape of the cushion plate 300 is maintained, the cushion plate 300 may maintain the role of maintaining the rigidity of the display apparatus while performing the shock mitigation function.

Therefore, according to an embodiment of the present disclosure, the heat-dissipation member 350 is inserted or accommodated into the inner partial area of the cushion plate 300, so that the basic shape of the cushion plate 300 is maintained, thereby maintaining the function of the cushion plate 300 as well as improving the heat-dissipation performance while maintaining the rigidity of each of the display device 10 and the display apparatus 1.

In one example, the heat-dissipation member 350 may be in contact with the upper surface and the lower surface of heat-dissipation member accommodating space 301 and may not occupy an entirety of the heat-dissipation member accommodating space 301 but may be spaced apart, by a predetermined distance, from the side surface of the heat-dissipation member accommodating space 301.

In this case, an air gap 360 may be provided between the heat-dissipation member 350 and the side surface of the heat-dissipation member accommodating space 301.

When the display panel 100 is bent and thus the rear part BP thereof is attached to the cushion plate 300, pressure may be applied not only to the cushion plate 300 but also to the heat-dissipation member 350 inserted or accommodated in the heat-dissipation member accommodating space 301.

In this case, even though the same level of pressure is applied to the cushion plate 300 and the heat-dissipation member 350, resistances thereof to the pressure may be different from each other because the cushion plate 300 and the heat-dissipation member 350 have different stacked structures.

Therefore, when the pressure is applied to the cushion plate 300 and the heat-dissipation member 350 in the vertical direction, the cushion plate 300 and the heat-dissipation member 350 may interfere with each other due to the pressure, such that the heat-dissipation member 350 or the cushion plate 300 may be damaged.

However, as in an embodiment of the present disclosure, the heat-dissipation member 350 is spaced, by a predetermined distance, from the side surface of the heat-dissipation member accommodating space 301. Thus, even when the pressure in the vertical direction is applied to the cushion plate 300 and the heat-dissipation member 350, they may not interfere with each other due to the space or distance.

Particularly, when the heat-dissipation member 35 has interference with the cushion plate 300, dust may be generated from the heat-dissipation member 350. However, when the heat-dissipation member 350 is spaced apart, by a predetermined distance, from the side surface of the heat-dissipation member accommodating space 301, such dust generation may be minimized or reduced.

Therefore, according to an embodiment of the present disclosure, since the predetermined spacing is defined therebetween so that the heat-dissipation member 350 does not contact the side surface of the heat-dissipation member accommodating space 301, even when the cushion plate 300 is pressurized such that the pressure is applied to the heat-dissipation member 350, the interference that may occur between the heat-dissipation member 350 and the cushion plate 300 may be minimized or reduced, thereby minimizing or reducing the dust generation from and damage to the heat-dissipation member 350.

Herein, the air gap 360 refers to a gap filled with air between the heat-dissipation member 350 and the side surface of the heat-dissipation member accommodating space 301.

When the display panel 100 is bent and thus the rear part BP and the bent panel fixing member 400 are attached to the cushion plate 300, a pressure may be applied to the front part FP of the display panel 100 such that the panel may be deformed.

However, according to an embodiment of the present disclosure, the air gap 360 acts as shock absorbing means. Thus, even when the display panel 100 is bent and thus the bent panel fixing member 400 is attached thereto, the deformation of the panel due to a pressure against the upper surface of the display panel 100 may be minimized or reduced.

Further, according to an embodiment of the present disclosure, the heat-dissipation member 350 having a predetermined thickness and the air gap 360 are disposed at the heat-dissipation member accommodating space 301 of the cushion plate 300. Thus, the heat-dissipation effect from the driving integrated circuit 160 having the high heat disposed under the cushion plate 300 so as to overlap the heat-dissipation member accommodating space 301 may be maximized.

The heat-dissipation member 350 may not occupy an entirety of the heat-dissipation member accommodating space 301. Thus, the air gap 360 may be formed to surround the circumference of the heat-dissipation member 350. Due to the trapped air at the air gap 360, the heat-dissipation performance may be further improved compared to a case in which only the heat-dissipation member 350 is disposed.

Figure 4:
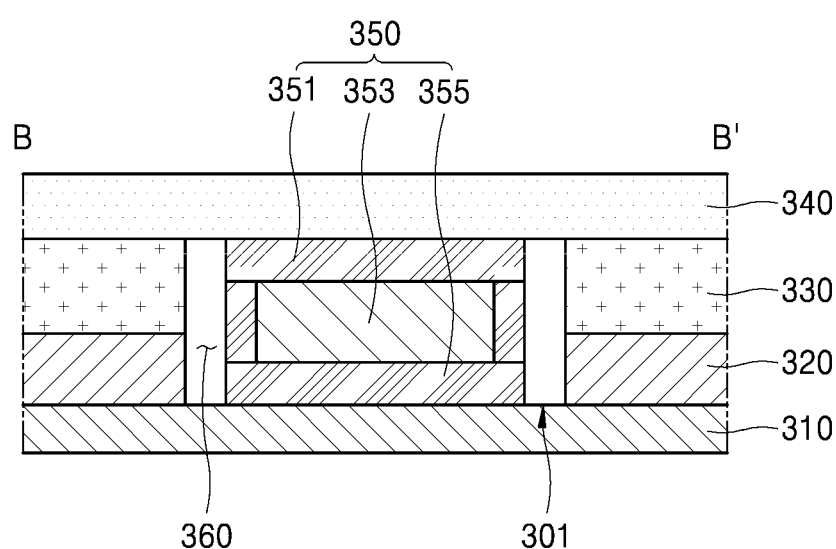
FIG. 4 is a cross-sectional view of a heat-dissipation member inserted inside a plate according to an embodiment of the present disclosure.

The heat-dissipation member 350 may have a structure in which a first adhesive layer 351, a conductive layer 353, and a second adhesive layer 355 are laminated as shown in FIG. 4. In this case, the first adhesive layer 351 may contact the embossed layer 340 of the cushion plate 300, and the second adhesive layer 355 may contact the heat-dissipation layer 310 of the cushion plate 300.

Each of the first adhesive layer 351 and the second adhesive layer 355 may be embodied as a double-sided adhesive layer formed of a PET film, while the conductive layer 353 may be embodied as a graphite sheet layer having high thermal conductivity.

The conductive layer 353 is embodied as a graphite sheet layer. In this case, the graphite sheet layer may be occurred an interfacial delamination in the Z-axis direction. Thus, it is preferred that the graphite sheet layer is enclosed and sealed with the first adhesive layer 351 and the second adhesive layer 355.

Figure 5:
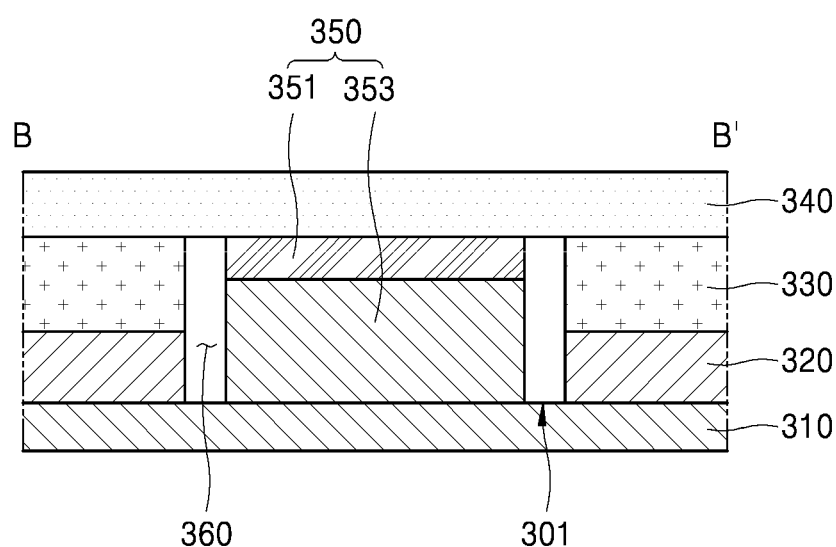
FIG. 5 is a cross-sectional view of a heat-dissipation member inserted inside a plate according to another embodiment of the present disclosure.

Further, the heat-dissipation member 350 may have a structure in which the first adhesive layer 351 and the conductive layer 353 are laminated as shown in FIG. 5. In this case, the first adhesive layer 351 may contact the embossed layer 340 of the cushion plate 300, and the conductive layer 353 may contact the heat-dissipation layer 310 of the cushion plate 300.

The first adhesive layer 351 may be embodied as a double-sided adhesive layer formed of a PET film, and the conductive layer 353 may be formed of a metal layer, and for example, may include copper (Cu) having high thermal conductivity.

When the heat-dissipation member 350 and the cushion plate 300 are formed of the same metal, they have similar thermal conductivity to each other, such that more efficient and improved heat-dissipation effect may be achieved.

For example, when the heat-dissipation member 350 is formed of copper and the heat-dissipation layer 310 of the cushion plate 300 is made of copper, the heat-dissipation member 350 and the cushion plate 300 constitute the same metal layer. Thus, in an area corresponding to the driving integrated circuit 160, the heat-dissipation layer 310 has a thick thickness, and thus an improved or enhanced heat-dissipation effect may be obtained.

Therefore, the high heat generated from the driving integrated circuit 160 disposed at the rear part BP of the display panel 100 may transferred to the second backplate 220 and the bent panel fixing member 400, and then the high heat may be effectively dissipated through the heat-dissipation layer 310, the heat-dissipation member 350 of the cushion plate 300 and air gap.

The display pad part may be disposed at a distal end or an end portion of the display substrate 110 on which the driving integrated circuit 160 is mounted.

The display pad part may be electrically connected to a flexible circuit board 500 on which a circuit board is mounted.

The flexible circuit board 500 may be electrically connected to the display pad part provided at the distal end of the display substrate 110 via a conductive adhesive layer 170 using a film attaching process, and may be positioned under the lower surface of the display panel 100.

In this case, the conductive adhesive layer 170 may use an ACF (Anisotropic Conductive Film).

The circuit board may provide or apply the image data and the timing synchronization signal supplied from the host driving system to the driving integrated circuit 160, and may provide or apply voltages for driving the pixel array part 120, the gate driving circuitry, and the driving integrated circuit 160 thereto, respectively.

In one example, a bent part reinforcing member 600 may be disposed at an outer surface 111 of the bent part BNP of the display panel 100. The bent part reinforcing member 600 may cover the bent part BNP, and extend to cover at least a partial area of the front part FP and at least a partial area of the rear part BP. The bent part reinforcing member 600 may be a reinforcing member, but embodiments of the present disclosure are not limited thereto.

The bent part reinforcing member 600 may include resin, for example, an ultraviolet (UV) curable acrylic resin. However, embodiments of the present disclosure are not limited thereto.

In detail, the bent part reinforcing member 600 may be formed of a cured material of a resin by a curing process after coating the resin. When the resin includes an ultraviolet curable resin, the curing may be performed using UV.

The bent part reinforcing member 600 may be disposed at the outer portion or outer surface 111 of the display panel 100 to cover various signal lines between the encapsulation portion 130 of the display panel 100 and the display pad part. Accordingly, the bent part reinforcing member 600 may prevent moisture penetrating into the signal line and protect the signal line from external impact.

Further, since the bent part reinforcing member 600 is disposed at the outer portion or outer surface 111 of the bent part BNP, the rigidity of the display panel 100 in an area of the bent part BNP from which the backplate has been removed may be supported.

A display apparatus according to an embodiment of the present disclosure comprises a display panel including a front part, a bent part, and a rear part; a first plate disposed at a lower portion of the front part; a second plate disposed at a lower portion of the display panel, the rear part of the display panel being disposed at a lower portion of the second plate; a heat-dissipation member accommodating space disposed in the second plate; and a heat-dissipation member in the heat-dissipation member accommodating space.

According to some embodiments of the present disclosure, the rear part of the display panel may extend from the bent part of the display panel and the rear part of the display panel may be disposed under the front part of the display panel.

According to some embodiments of the present disclosure, the display apparatus may further include a driving integrated circuit disposed at a lower portion of the rear part of the display panel, the driving integrated circuit overlaps the heat-dissipation member accommodating space.

According to some embodiments of the present disclosure, the heat-dissipation member accommodating space may be defined by an upper inner surface and a lower inner surface of the second plate, and the heat-dissipation member may be in contact with the upper inner surface and the lower inner surface of the second plate.

According to some embodiments of the present disclosure, the heat-dissipation member accommodating space may be defined by an inner side surface of the second plate and the heat-dissipation member may be spaced apart from the inner side surface of the second plate.

According to some embodiments of the present disclosure, the heat-dissipation member accommodating space may be defined an inner side surface of the second plate, and the display apparatus may further include an air gap between the heat-dissipation member and the inner side surface of the second plate.

According to some embodiments of the present disclosure, the second plate may further include a heat-dissipation layer, an anti-lift layer, a cushion layer and an embossed layer.

According to some embodiments of the present disclosure, the heat-dissipation member accommodating space may be free of the anti-lift layer and the cushion layer.

According to some embodiments of the present disclosure, an upper surface of the heat-dissipation member contacts the embossed layer, and a lower surface of the heat-dissipation member may contact the heat-dissipation layer.

According to some embodiments of the present disclosure, the heat-dissipation member may include a first adhesive layer, a conductive layer, and a second adhesive layer, and the conductive layer may include a graphite sheet layer.

According to some embodiments of the present disclosure, the heat-dissipation member may include an adhesive layer and a conductive layer, and the conductive layer may include a metal layer.

According to some embodiments of the present disclosure, the heat-dissipation layer may include a material and the conductive layer includes the material, the material being metal. The material may include copper.

According to some embodiments of the present disclosure, the display apparatus may further include a cover member connected to the display panel, and a frame disposed at the display panel.

According to some embodiments of the present disclosure, the display apparatus may further include a connection member disposed at a lower surface of the second plate, an adhesive layer disposed at the lower surface of the second plate, and a third plate disposed at a lower surface of the adhesive layer, the rear part of the display panel disposed at a lower surface of the third plate.

A display apparatus according to other embodiment of the present disclosure comprises a display panel including a first part, a second part, and a bent part between the first part and the second part; a plate disposed on the display panel, the plate including: a heat-dissipation layer; an anti-lift layer disposed on the heat-dissipation layer; a cushion layer on the anti-lift layer; and an embossed layer on the cushion layer; an accommodating space inside the plate with a top of the accommodating space defined by the heat-dissipation layer, a lower of the accommodating space defined by the embossed layer, and sides of the accommodating space defined by the anti-lift layer and the cushion layer; and a heat-dissipation member in the accommodating space.

According to some embodiments of the present disclosure, the heat-dissipation member may directly contact the heat-dissipation layer and the embossed layer of the plate.

According to some embodiments of the present disclosure, the display apparatus may further include an air gap at the accommodating space between the heat-dissipation member and sides of the accommodating space defined by the anti-lift layer and the cushion layer of the plate.

According to some embodiments of the present disclosure, the display apparatus may further include a first adhesive layer on the heat-dissipation member in contact with the heat-dissipation layer of the cushion plate at the top of the accommodating space; and a second adhesive layer on the heat-dissipation member and in contact with the embossed layer of the plate at the bottom of the accommodating space.

According to some embodiments of the present disclosure, the display apparatus may further include an adhesive layer on the heat-dissipating member and in contact only with the heat-dissipating member and the heat-dissipating layer of the plate at the top of the accommodating space.

It will be apparent to those skilled in the art that various modifications and variations can be made in the present disclosure without departing from the technical idea or scope of the disclosures. Thus, it may be intended that embodiments of the present disclosure cover the modifications and variations of the disclosure provided they come within the scope of the appended claims and their equivalents.

The invention claimed is:

1. A display apparatus, comprising:
a display panel including a front part, a bent part, and a rear part;
a first plate disposed at a lower portion of the front part;
a second plate disposed at a lower portion of the display panel, the rear part of the display panel being disposed at a lower portion of the second plate;
a heat-dissipation member accommodating space disposed inside the second plate; and
a heat-dissipation member in the heat-dissipation member accommodating space.

2. The display apparatus of claim 1, wherein the rear part of the display panel extends from the bent part of the display panel and the rear part of the display panel is disposed under the front part of the display panel.

3. The display apparatus of claim 1, further comprising:
a driving integrated circuit disposed on a lower portion of the rear part of the display panel,
wherein the driving integrated circuit overlaps the heat-dissipation member accommodating space.

4. The display apparatus of claim 1, wherein the heat-dissipation member accommodating space is defined by an upper inner surface and a lower inner surface of the second plate, and the heat-dissipation member is in contact with the upper inner surface and the lower inner surface of the second plate.

5. The display apparatus of claim 1, wherein the heat-dissipation member accommodating space is defined by an inner side surface of the second plate and the heat-dissipation member is spaced apart from the inner side surface of the second plate.

6. The display apparatus of claim 1, wherein the heat-dissipation member accommodating space is defined an inner side surface of the second plate, the display device further comprising:
an air gap between the heat-dissipation member and the inner side surface of the second plate.

7. A display apparatus, comprising:
a display panel including a front part, a bent part, and a rear part;
a first plate disposed at a lower portion of the front part;
a second plate disposed at a lower portion of the display panel, the rear part of the display panel being disposed at a lower portion of the second plate;
a heat-dissipation member accommodating space disposed inside the second plate; and
a heat-dissipation member in the heat-dissipation member accommodating space,
wherein the second plate further includes a heat-dissipation layer, an anti-lift layer, a cushion layer and an embossed layer.

8. The display apparatus of claim 7, wherein the heat-dissipation member accommodating space is free of the anti-lift layer and the cushion layer.

9. The display apparatus of claim 8, wherein an upper surface of the heat-dissipation member contacts the embossed layer, and a lower surface of the heat-dissipation member contacts the heat-dissipation layer.

10. The display apparatus of claim 7, wherein the heat-dissipation member includes a first adhesive layer, a conductive layer, and a second adhesive layer, and the conductive layer includes a graphite sheet layer.

11. The display apparatus of claim 7, wherein the heat-dissipation member includes an adhesive layer and a conductive layer, and the conductive layer includes a metal layer.

12. The display apparatus of claim 11, wherein the heat-dissipation layer includes a material and the conductive layer includes the material, the material being metal.

13. The display apparatus of claim 12, wherein the material includes copper.

14. The display apparatus of claim 1, further comprising:
a cover member coupled to the display panel; and
a frame disposed at the display panel.

15. The display apparatus of claim 1, further comprising:
a connection member disposed at a lower surface of the second plate; and
an adhesive layer disposed at the lower surface of the second plate; and
a third plate disposed at a lower surface of the adhesive layer, the rear part of the display panel disposed at a lower surface of the third plate.

16. A display apparatus, comprising:
a display panel including a first part, a second part, and a bent part between the first part and the second part;
a plate disposed on the display panel, the plate including:
a heat-dissipation layer;
an anti-lift layer disposed on the heat-dissipation layer;
a cushion layer on the anti-lift layer; and
an embossed layer on the cushion layer;
an accommodating space inside the plate with a top of the accommodating space defined by the heat-dissipation layer, a bottom of the accommodating space defined by the embossed layer, and sides of the accommodating space defined by the anti-lift layer and the cushion layer; and
a heat-dissipation member in the accommodating space.

17. The display apparatus of claim 16, wherein the heat-dissipation member directly contacts the heat-dissipation layer and the embossed layer of the plate.

18. The display apparatus of claim 16, further comprising:
an air gap in the accommodating space between the heat-dissipation member and sides of the accommodating space defined by the anti-lift layer and the cushion layer of the plate.

19. The display apparatus of claim 16, further comprising:
a first adhesive layer on the heat-dissipation member in contact with the heat-dissipation layer of the cushion plate at the top of the accommodating space; and
a second adhesive layer on the heat-dissipation member and in contact with the embossed layer of the plate at the bottom of the accommodating space.

20. The display apparatus of claim 16, further comprising:
an adhesive layer on the heat-dissipating member and in contact only with the heat-dissipating member and the heat-dissipating layer of the plate at the top of the accommodating space.

* * * * *